US008778576B2

(12) United States Patent
Matsui et al.

(10) Patent No.: US 8,778,576 B2
(45) Date of Patent: Jul. 15, 2014

(54) EXPOSURE METHOD AND EXPOSURE DEVICE

(75) Inventors: Kohei Matsui, Tokyo (JP); Kaoru Hatta, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 6 days.

(21) Appl. No.: 13/518,201

(22) PCT Filed: Dec. 20, 2010

(86) PCT No.: PCT/JP2010/007380
§ 371 (c)(1),
(2), (4) Date: Jun. 21, 2012

(87) PCT Pub. No.: WO2011/077697
PCT Pub. Date: Jun. 30, 2011

(65) Prior Publication Data
US 2012/0258390 A1 Oct. 11, 2012

(30) Foreign Application Priority Data
Dec. 24, 2009 (JP) ................................. 2009-292462

(51) Int. Cl.
*G03F 1/00* (2012.01)
(52) U.S. Cl.
USPC ................ 430/7; 430/394; 349/106; 349/114
(58) Field of Classification Search
CPC ... G03F 7/0007; G03F 7/70466; G02B 5/201; G02F 1/133516
USPC ................. 430/7, 394; 349/106, 114
See application file for complete search history.

(56) References Cited

U.S. PATENT DOCUMENTS

| 8,189,152 | B2 * | 5/2012 | Nakagawa | .................... | 349/129 |
| 2004/0069757 | A1 * | 4/2004 | Nakata et al. | ............ | 219/121.69 |
| 2004/0142254 | A1 * | 7/2004 | Tanaka et al. | ..................... | 430/7 |
| 2006/0204863 | A1 * | 9/2006 | Nakata et al. | ..................... | 430/5 |
| 2008/0239266 | A1 * | 10/2008 | Noboru | ........................... | 355/53 |
| 2009/0244466 | A1 * | 10/2009 | Tojo et al. | ..................... | 349/139 |
| 2010/0118246 | A1 * | 5/2010 | Nakagawa | .................... | 349/129 |

FOREIGN PATENT DOCUMENTS

| JP | 2007-121344 | 5/2007 |
| JP | 2008-216593 | 9/2008 |
| JP | 2009-75529 | 4/2009 |
| JP | 2009-216762 | 9/2009 |

OTHER PUBLICATIONS

International Search Report of Corresponding PCT Application PCT/JP2010/007380 mailed Mar. 1, 2011.

* cited by examiner

*Primary Examiner* — Stewart Fraser

(57) ABSTRACT

In an exposure method, a photomask and a substrate having a resist applied thereto are positioned so as to be opposed to a blinking light source that repeatedly emits light and emits no light. The blinking light source is caused to blink with the substrate being continuously conveyed in a direction orthogonal to a direction in which openings in the photomask are aligned, so that multiple exposures are intermittently performed. In each exposure, a speed at which the substrate is conveyed is controlled such that the openings of the photomask overlap a portion of exposed patterns having been obtained by an immediately preceding exposure, thereby obtaining colored layers which are formed into a striped-shape and extend in the direction in which the substrate is conveyed.

10 Claims, 19 Drawing Sheets

United States Patent US 8,778,576 B2

EXPOSURE METHOD AND EXPOSURE DEVICE

CROSS REFERENCE TO RELATED APPLICATIONS

This application is a national phase application, under 35 U.S.C. 371, of international application No. PCT/JP2010/007380, filed on Dec. 20, 2010, which claimed priority to Japanese Patent Application No. 2009-292462, filed on Dec. 24, 2009, the disclosures of which are incorporated herein by reference.

TECHNICAL FIELD

The present invention relates to an exposure method and an exposure device for producing color filter substrates for use in liquid crystal display devices and the like.

BACKGROUND ART

In recent years, increase in size of liquid crystal display devices leads to increase in size of color filters for use in the liquid crystal display devices. In a process of producing a color filter, patterning is performed by using a photolithography method to form colored layers. However, since a large exposure mask is very expensive, a problem arises that production cost for the color filters may be increased. Thus, novel exposure methods using small masks have been variously suggested.

CITATION LIST

Patent Literature

Patent Literature 1: Japanese Laid-Open Patent Publication No. 2008-216593 Patent Literature 2: Japanese Laid-Open Patent Publication No. 2007-121344

SUMMARY OF THE INVENTION

Problems to be Solved by the Invention

As an exposure method using a small mask, a method (hereinafter, referred to as a "small mask continuous exposure mode") for repeatedly performing an exposure of the entire surface of a substrate to be exposed to light while conveying the substrate, by using an exposure machine in which a photomask having a size smaller than a size of a display pixel area of a color filter substrate is mounted to an exposure head, is known.

FIG. 13 illustrates a substrate exposure method using the small mask continuous exposure mode. In the following description, a direction in which the substrate is conveyed is the Y-axis forward direction.

Firstly, a substrate 920 having a resist applied thereto is positioned below a blinking light source (not shown) and a photomask 910. In the photomask 910, a plurality of openings 911 are aligned in the X-axis direction and the Y-axis direction so as to form a matrix. Each opening 911 corresponds to one colored pixel on the color filter substrate. Further, the plurality of openings corresponding to colored pixels of the same color are formed in the X-axis direction. Subsequently, the substrate 920 is conveyed in the Y-axis forward direction (a direction indicated by an arrow in the drawing), and the resist on the substrate 920 is exposed to light through the openings 911 at a position shown in FIG. 13(a). Next, the substrate 920 is conveyed to a position (FIG. 13(b)) at which none of the openings 911 are located above exposed patterns 921. In this position, the resist on the substrate 920 is exposed to light through the openings 911, and the exposed patterns 921 formed as a plurality of dots aligned in the X-axis direction are provided at regular intervals in the Y-axis direction.

In each exposure to light, alignment between the photomask 910 and the substrate 920 is performed based on images which are taken by a camera and represent the photomask and a pattern on the substrate 920. More specifically, the photomask 910 has formed therein a pattern following opening 912 used for detecting a position of the substrate 920, and a position of the substrate 920 is detected based on an image pattern of the substrate 920, which is taken through the pattern following opening 912. The position of the photomask 910 is adjusted in the X-axis direction based on the position of the substrate 920 having been detected. As a result, a misalignment in relative position between the photomask and the substrate in the X-axis direction is corrected with a high accuracy. Further, a time at which light is to be emitted from the blinking light source is determined based on the position of the substrate 920 having been detected.

As a cause of the misalignment between the photomask and the substrate, a distortion of a conveyor shaft of a substrate conveyor device, a rotation of the substrate caused by yawing of the substrate, or a rotation of the photomask mounted to an exposure head, may be considered. Hereinafter, problems caused when a misalignment in relative position between the photomask and the substrate occurs will be sequentially described for each cause of the misalignment.

FIG. 14 illustrates deviation in position of a substrate, and FIG. 15 illustrates a direction in which the position of the substrate deviates.

As shown in FIG. 14(a), in a substrate conveyor device 930, one side of the substrate 920 along the Y-axis direction is secured to a conveyor shaft 931a by a fixing component 932, and the other side thereof is supported by a conveyor shaft 931b. The substrate conveyor device 930 conveys the substrate 920 in the Y-axis forward direction shown in FIG. 14 in a state where the substrate 920 is held at one side thereof.

When the substrate conveyor device 930 that holds only one side of the substrate 920 is used, a deviation in position of the substrate 920 is caused as indicated by dashed lines due to a distortion of the conveyor shaft 931a (FIG. 14(b)) or yawing of the substrate 920 which is being conveyed (FIG. 14(c)). The substrate 920 is secured only by the conveyor shaft 931a. Therefore, the deviation in position of the substrate 920 is caused by, for example, rotation of the substrate 920 about a point m near the conveyor shaft 931a. When the rotation center of the substrate 920 is near the conveyor shaft 931a, the greater a distance from the point m corresponding to the rotation center is, the greater the deviation in position in the X-axis direction and the Y-axis direction is, as shown in FIG. 15. For example, at a point d which is furthest from the point m, a deviation 994 in position in the X-axis direction, and a deviation 995 in position in the Y-axis direction occur. The deviation in position in the X-axis direction can be corrected by the photomask being moved during exposure to light as described above. However, the deviation in position in the Y-axis direction cannot be corrected only by adjustment during exposure time, and the deviation may remain uncorrected.

FIG. 16 is a plan view illustrating a relationship between a rotation of the substrate and deviation in position of colored layers. FIG. 17 is a cross-sectional view taken along a line XVII-XVII shown in FIG. 16. FIG. 18 is a cross-sectional view taken along a line XVIII-XVIII shown in FIG. 16.

When the substrate 920 rotates, the greater a distance from the rotation center of the substrate 920 is, the greater a misalignment between the substrate 920 and the photomask is. Thus, for example, from a portion A toward a portion B, as shown in the drawing, in a region in which exposure to light is performed by using a photomask 910a, colored layers 980 are deviated in the Y-axis backward direction. Also from the left end portions toward the right end portions in regions in which exposure to light is performed by using photomasks 910b and 910c, the colored layers 980 are similarly deviated in the Y-axis backward direction. As a result, amounts of the deviation of the colored layers 980 may be greatly changed near a joint (dashed line) between the photomasks adjacent to each other, so that non-uniformity may occur in display.

As shown in FIGS. 17 and 18, in a case where widths with which the colored layer 980 and a black matrix 960 overlap each other are different (as indicated as W1 and W2), maximal heights (height from the surface of the substrate. Indicated as H1 and H2) of portions in which the colored layer and the black matrix overlap each other are different. Specifically, the greater a width with which the colored layer 980 and the black matrix 960 overlap each other is, the greater is the maximal height of the colored layer 980. In comparison between the colored layer as indicated by a solid line shown in FIG. 17 and the colored layer as indicated by a solid line shown in FIG. 18, W1<W2 and H1<H2 are satisfied. The difference in the maximal height of the colored layer 980 affects an orientation of a liquid crystal which is sealed between a color filter substrate and an opposing substrate. As a result, a problem arises that a liquid crystal display device is produced such that non-uniform display occurs at a boundary between regions exposed to light.

FIG. 19 is a plan view illustrating a relationship between a rotation of a photomask and a deviation in position of a colored layer.

Also when the photomask is rotated, the greater a distance from the rotation center of the photomask is, the greater is misalignment between the substrate and the photomask. Therefore, the deviation in position of the colored layer 980 from the black matrix 960 is increased from the left side of the photomask toward the right side of the photomask as shown in, for example, FIG. 19.

In a case where the photomasks have been rotated by almost the same rotation angle in the same rotation direction, such as the photomask 910a and the photomask 910b, the colored layers tend to deviate in a similar direction by a similar deviation amount. Specifically, from a portion C toward a portion D, shown in the drawing, in a region in which exposure to light is performed by using the photomask 910a, the colored layers are deviated in the Y-axis backward direction. Also from a portion E toward a portion F, shown in the drawing, in a region in which exposure to light is performed by using the photomask 910b, the colored layers are similarly deviated in the Y-axis backward direction. As a result, a difference between the deviation of the colored layers in the portion D and the deviation of the colored layers in the portion E is great.

On the other hand, in a case where the photomasks have been rotated by almost the same rotation angle in the opposite rotation directions, such as the photomask 910b and the photomask 910c, the colored layers tend to deviate in directions opposite to each other by a similar deviation amount. Specifically, from the portion E toward the portion F, shown in the drawing, in the region in which exposure to light is performed by using the photomask 910b, the colored layers are deviated in the Y-axis backward direction. On the other hand, from a portion G toward a portion H, shown in the drawing, in a region in which exposure to light is performed by using the photomask 910c, the colored layers are deviated in the Y-axis forward direction. As a result, an amount of the deviation is almost the same between the colored layers in the portion F and the colored layers in the portion G. As described above, depending on the rotation centers and the rotation directions of the photomasks adjacent to each other, deviation of the colored layer may be greatly different between in the regions in which exposure to light is performed by using the adjacent photomasks, respectively. As a result, as in the cases described with reference to FIGS. 16 to 18, non-uniformity in display may occur in a liquid crystal display device.

Therefore, an object of the present invention is to make available an exposure method and an exposure device capable of producing a color filter which enables non-uniformity in display to be restrained also when the positional relationship is such that a misalignment between a substrate and a photomask occurs.

Solution to the Problems

The present invention is directed to an exposure method for forming, while conveying, in a first direction, a substrate having a light blocking layer formed in a grid-like shape, colored pixels of a color filter on the substrate. In the exposure method, a photomask having a plurality of openings, and the substrate having a resist applied thereto are positioned so as to be opposed to a blinking light source that repeatedly emits light and emits no light. The blinking light source is caused to blink while the substrate is being continuously conveyed in the first direction, to intermittently perform multiple exposures. The photomask is moved in a second direction orthogonal to the first direction, to perform alignment between the photomask and the substrate, in each exposure. Intervals at which the blinking light source blinks are controlled in each exposure such that a portion of the plurality of openings of the photomask overlaps a portion of exposed patterns having been obtained through the plurality of openings of the photomask by an immediately preceding exposure. A difference between a width of each opening of the photomask in the first direction, and a width, in the first direction, of one opening region surrounded by the light blocking layer is greater than a difference between a width of each opening of the photomask in the second direction, and a width, in the second direction, of one opening region surrounded by the light blocking layer.

Advantageous Effects of the Invention

According to the present invention, even when deviation in position of a substrate in a substrate conveying direction occurs, a color filter substrate can be exposed to light without generating defect.

DESCRIPTION OF EMBODIMENTS

First Embodiment

Figure 1:
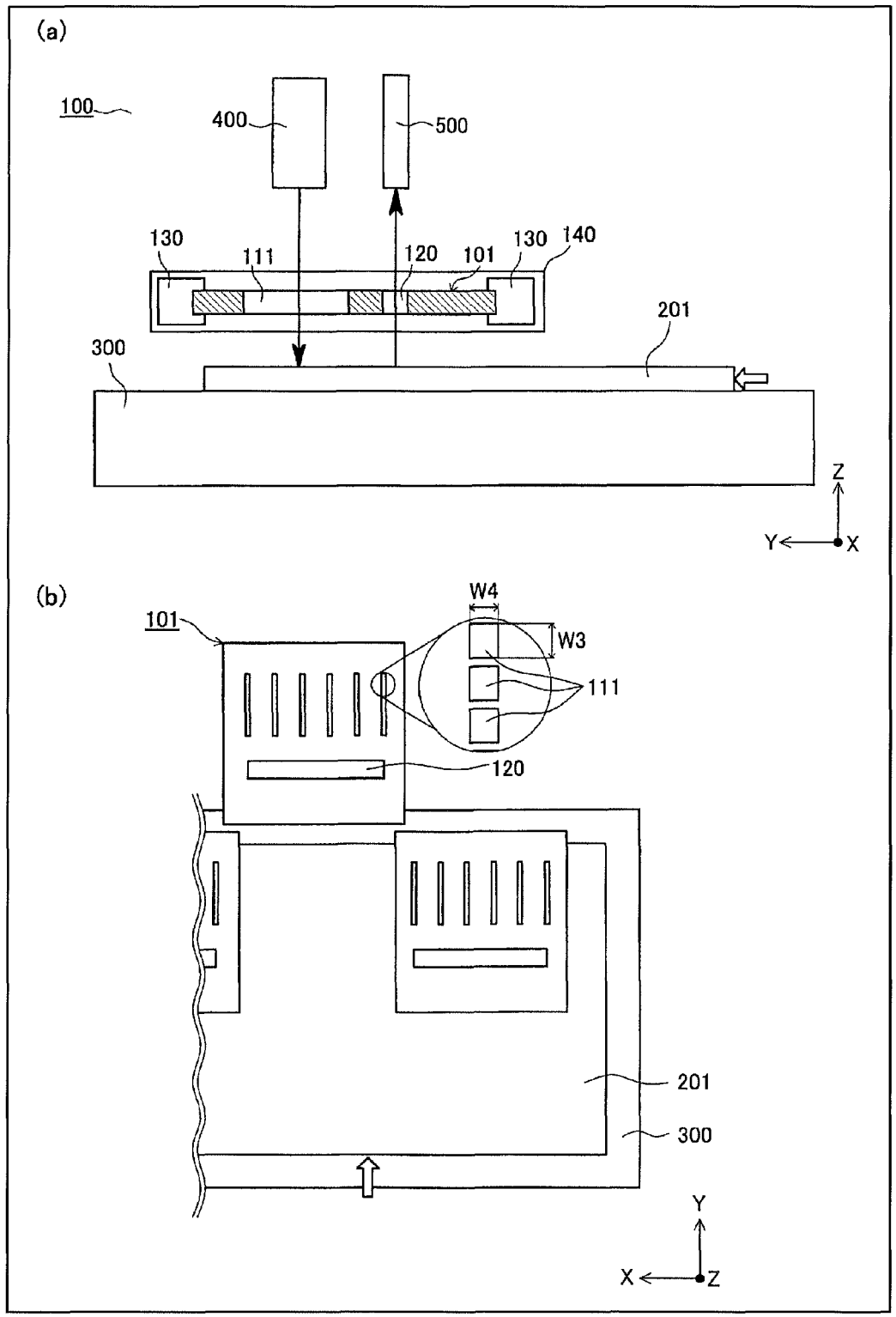
FIG. 1 illustrates an outline of a configuration of an exposure device according to a first embodiment.

FIG. 1 illustrates an outline of a configuration of an exposure device according to a first embodiment. More specifically, FIG. 1(a) is a side view of the exposure device, and FIG. 1(b) is a plan view of a photomask and a substrate as viewed from above. In the following description, a substrate conveying direction is the Y-axis forward direction.

An exposure device 100 shown in FIG. 1(a) includes a blinking light source 400, a photomask holding mechanism 130, a conveyor device 300, an image recognition device 500, and a photomask moving mechanism 140.

The blinking light source 400 is a light source that repeats light emission and light extinction at predetermined time intervals, and is implemented by pulse light emission of a laser device. Time intervals at which the blinking light source 400 emits light may be fixed or may be changed according to an instruction from the outside.

The photomask holding mechanism 130 holds a photomask 101 so as to locate the photomask 101 below the blinking light source 400. As shown in FIG. 1(b), the photomask 101 includes a plurality of openings 111 that are aligned so as to correspond to positions of colored pixels of the same color, and a pattern following opening 120 used by the image recognition device 500 for reading exposed patterns and the like on a substrate 201. As shown in a partially enlarged view of FIG. 1(b), in each column, the plurality of openings 111 are aligned at regular intervals. A column formed of the plurality of openings 111 is repeatedly located so as to be equally spaced in the row direction. Each of the openings 111 corresponds to one colored pixel, and the openings 111 aligned in the column direction further correspond to colored pixels, respectively, of the same color which are continuously aligned. The photomask holding mechanism 130 holds the photomask 101 such that the column direction of the openings 111 conforms to the Y-axis direction. In the exposure method and the exposure device according to the first embodiment, a plurality of the photomasks 101 may be aligned as shown in FIG. 1(b), or one photomask that covers the entirety of the exposed regions in the X-axis direction may be used. The openings of the photomask will be described below in detail.

Figure 14:
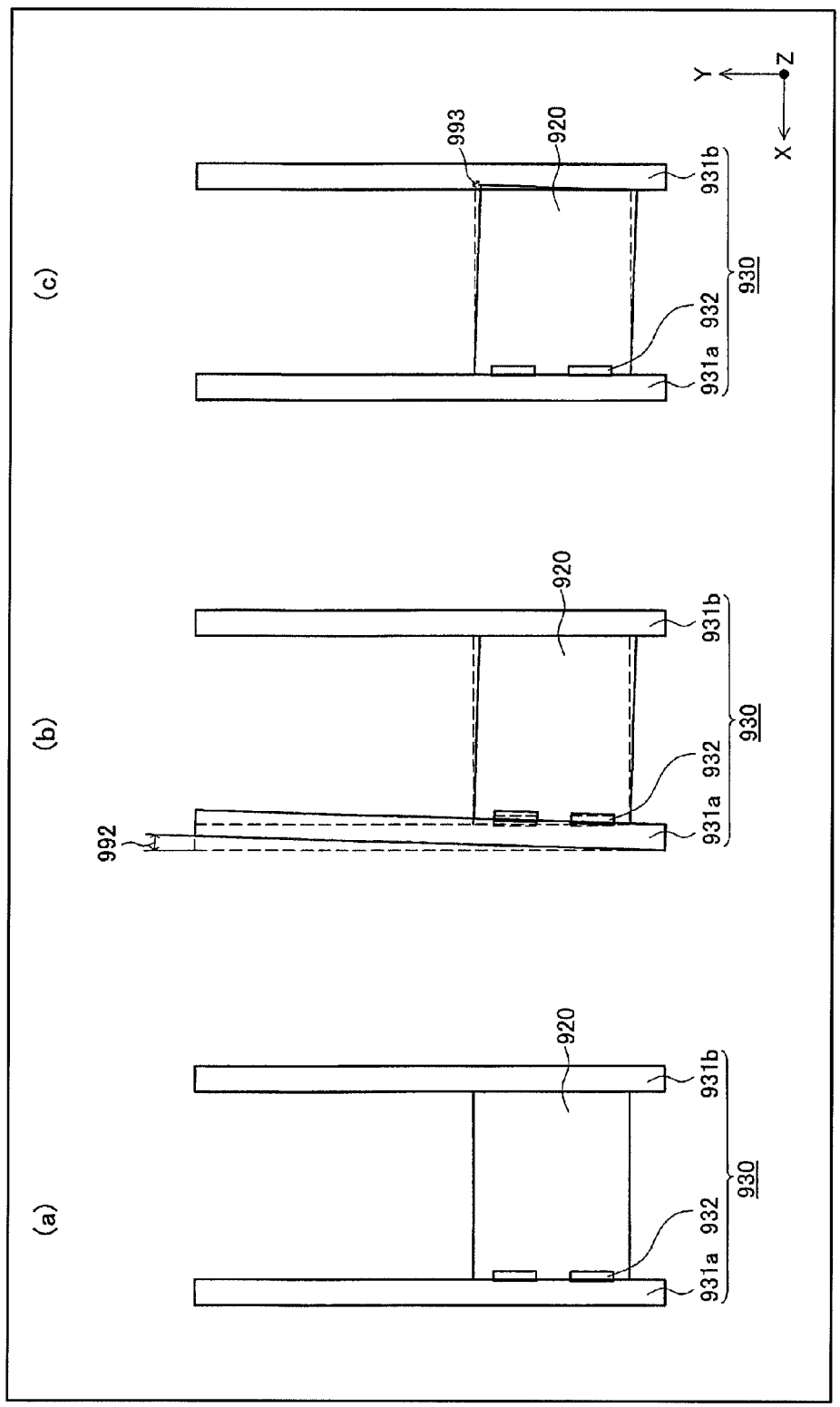
FIG. 14 illustrates deviation in position between a conveyor device and a substrate.
Figure 15:
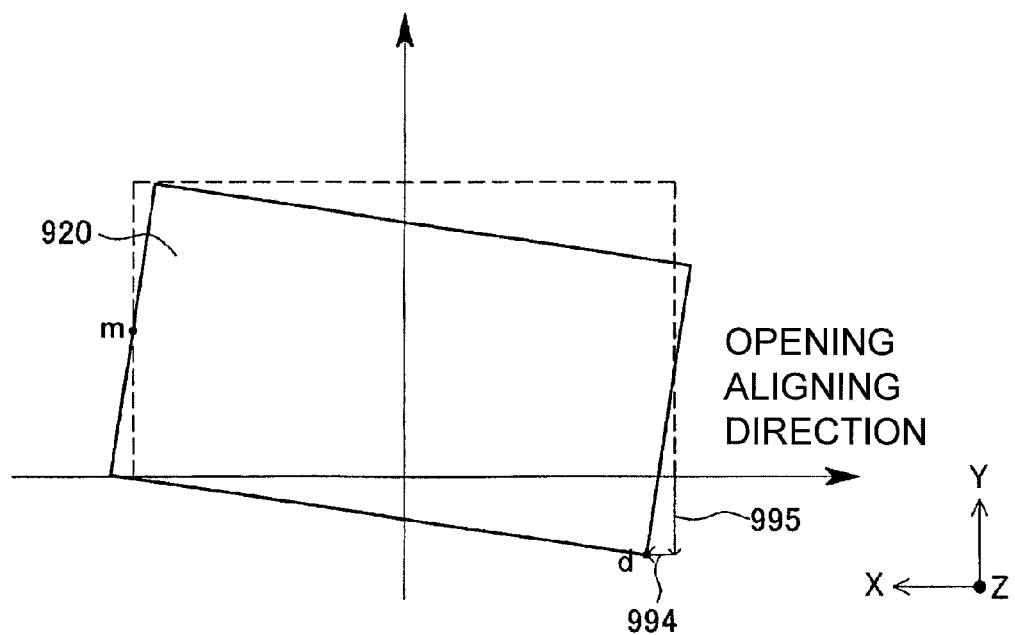
FIG. 15 illustrates a direction in which a position of the substrate deviates.
Figure 16:
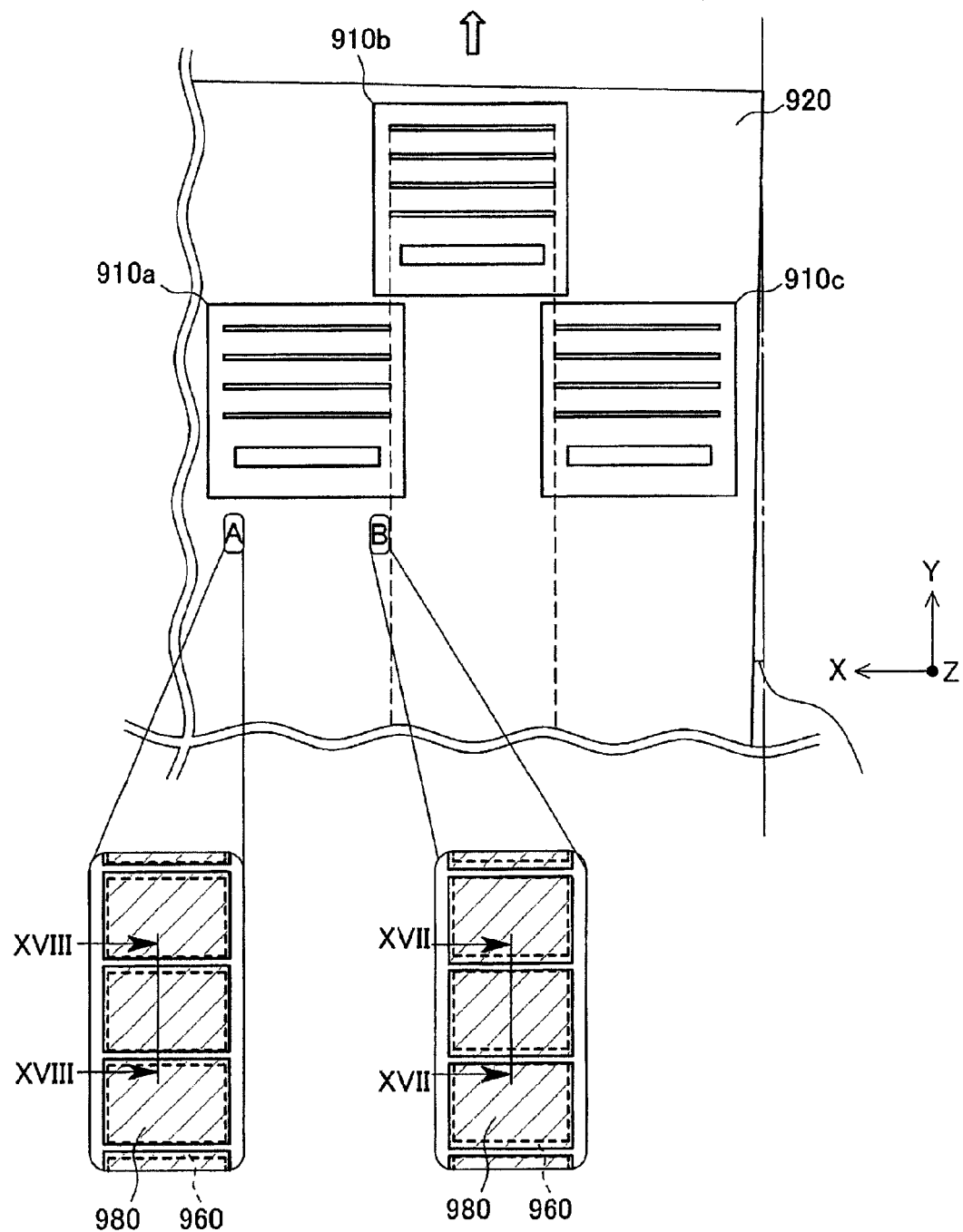
FIG. 16 is a plan view illustrating a relationship between a rotation of a substrate, and deviation in position of colored layers.
Figure 17:
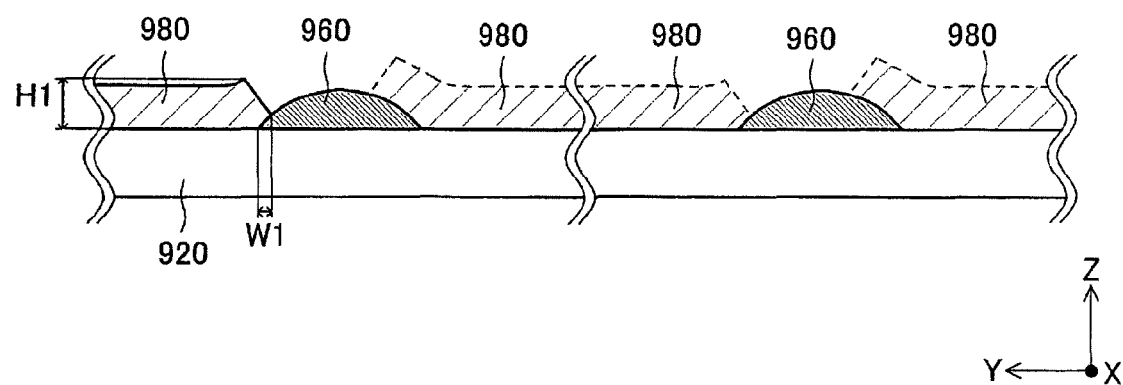
FIG. 17 is a cross-sectional view of a color filter substrate shown in FIG. 16 as taken along a line XVII-XVII.
Figure 18:
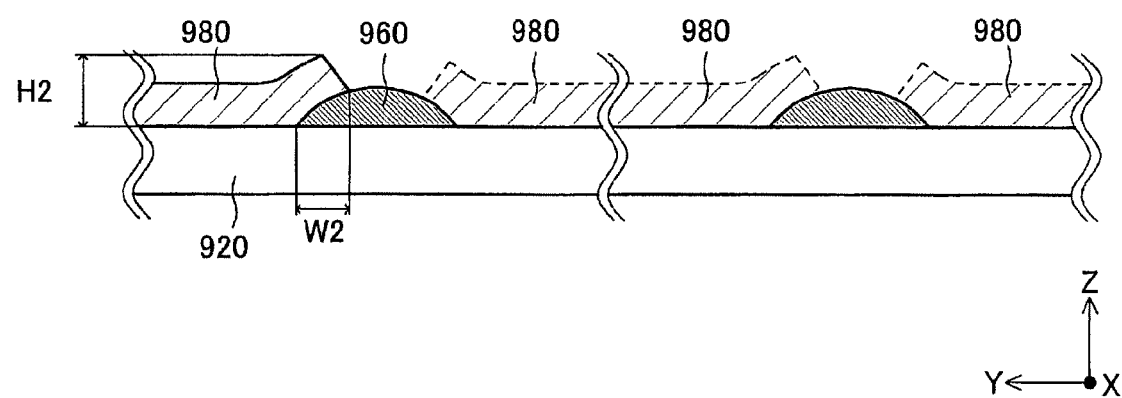
FIG. 18 is a cross-sectional view of the color filter substrate shown in FIG. 16 as taken along a line XVIII-XVIII.
Figure 19:
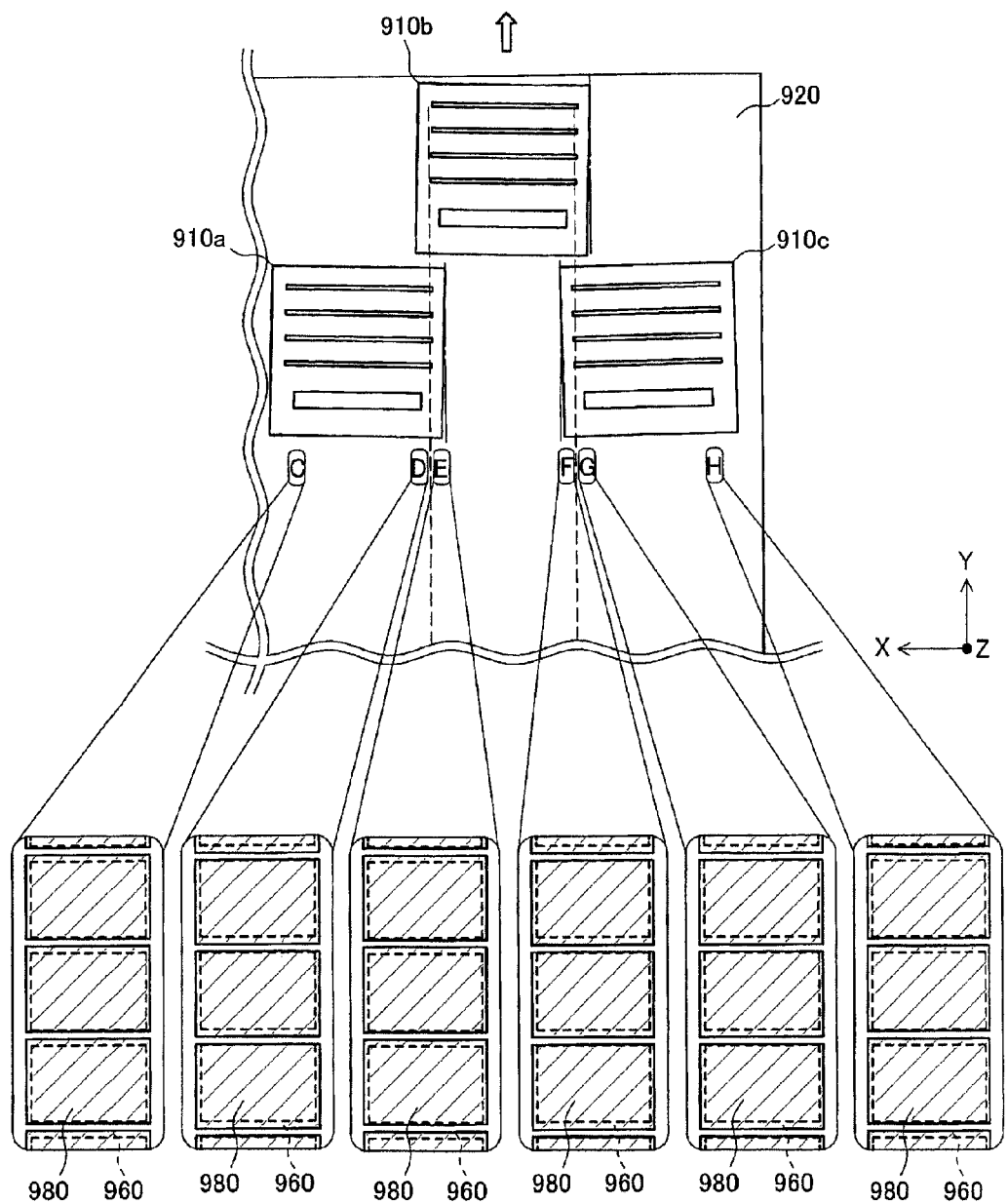
FIG. 19 is a plan view illustrating a relationship between a rotation of a photomask and a deviation in position of a colored layer.

The conveyor device 300 includes a conveying mechanism and a substrate securing mechanism, which are not shown, and continuously conveys the substrate 201 at a predetermined conveying speed in the Y-axis forward direction. As the conveying mechanism and the substrate securing mechanism, for example, the conveyor shafts and the fixing component as shown in FIG. 14 are used.

The image recognition device 500 takes images of the photomask 101 and the substrate 201, and detects a position of the substrate 201 relative to the photomask 101 based on the taken images. More specifically, the image recognition device 500 detects a positional relationship between the photomask 101 and the substrate 201, based on alignment marks in the taken image of the photomask 101, and an image pattern of the substrate 201 which has been taken through the pattern following opening 120.

The photomask moving mechanism 140 moves the photomask 101 based on the detection result from the image recognition device 500, and performs alignment between the photomask 101 and the substrate 201 in the X-axis direction. The alignment is performed when the blinking light source 400 emits no light.

A production method for producing a color filter substrate by using the exposure method according to the first embodiment will be described below with reference to FIGS. 2 and 3.

Figure 2:
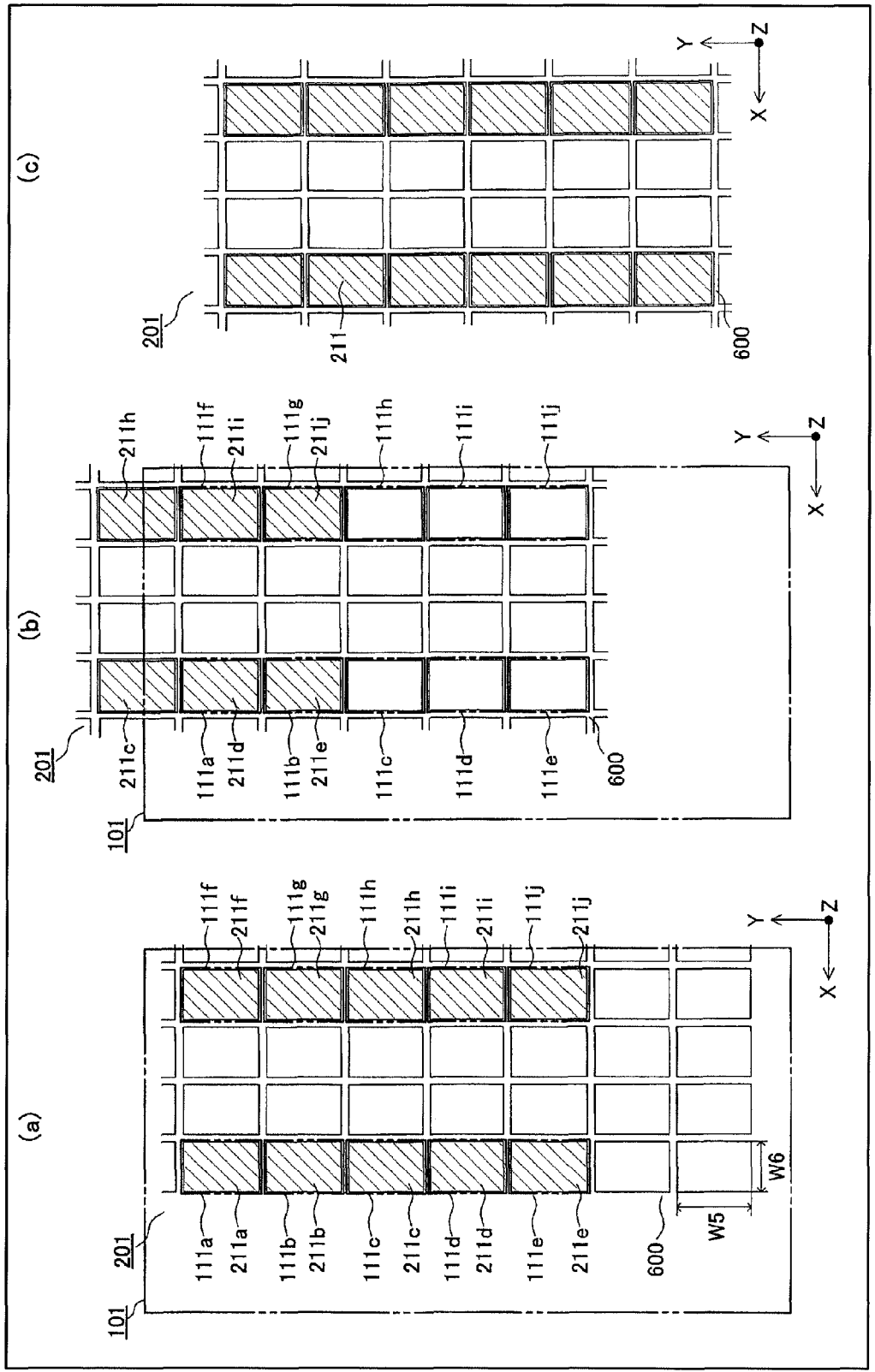
FIG. 2 illustrates an exemplary exposure method according to the first embodiment.
Figure 3:
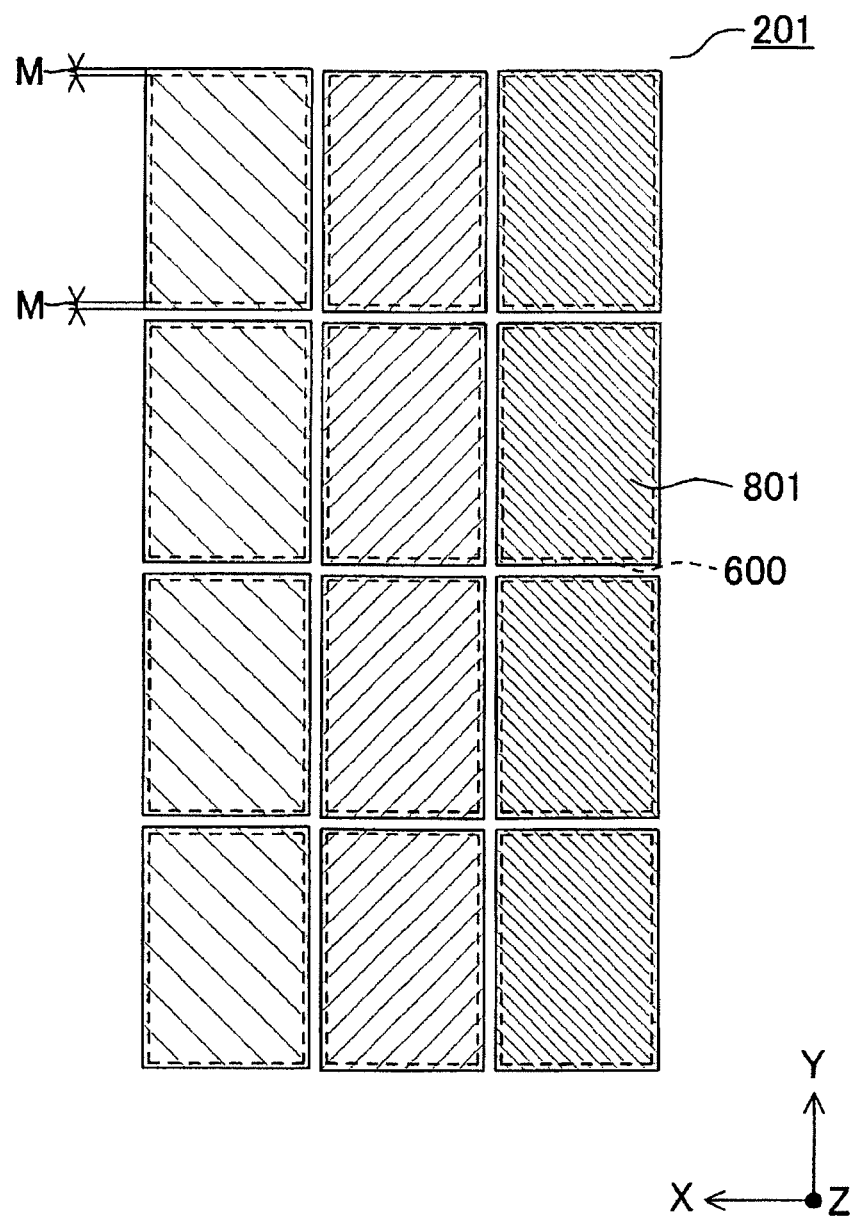
FIG. 3 is a plan view of a color filter substrate in which colored layers are formed as dots on a substrate including black matrixes.

FIG. 2 illustrates an exemplary exposure method according to the first embodiment, and illustrates an exemplary case in which the substrate having black matrixes formed thereon is exposed to light. Further, FIG. 3 is a plan view of the color filter substrate in which colored layers are formed as dots on the substrate including the black matrixes.

In FIG. 2, rectangular regions indicated by solid lines each represent an opening surrounded by a black matrix 600, and regions indicated by hatching each represent a portion in which a resist has been exposed to light. Further, alternate long and two short dashes lines represent the photomask 101 and openings 111a to 111j formed in the photomask 101. The openings 111a to 111j are openings corresponding to colored layers of the same color. In FIG. 2, due to size limitations of the drawing, a portion of the substrate 201 and a portion of the photomask 101 are illustrated. Further, also in FIG. 3, a portion of the substrate 201 is shown. A difference between a dimension W3 (see FIG. 1(b)) of one opening of the photomask 101 in the Y-axis direction, and a dimension W5 of one opening region, in the Y-axis direction, surrounded by the black matrix 600 is greater than a difference between a dimension W4 (see FIG. 1(b)) of one opening of the photomask 101 in the X-axis direction and a dimension W6, in the X-axis direction, of one opening region surrounded by the black matrix 600.

Firstly, the black matrixes 600 are formed so as to be grid-shaped, on the substrate 201. The method for forming the black matrixes 600 is not limited to any specific forming method, and various methods can be used.

Next, the photomask 101 is positioned so as to be opposed to the blinking light source 400. The substrate 201 having a resist applied thereto is conveyed by the conveyor device 300 so as to be located below the photomask 101. The blinking light source 400 is caused to emit light with the substrate 201 being conveyed in the Y-axis forward direction, and a region (hatching portion) on the substrate 201 which is exposed from each of the rectangular openings 111a to 111j (regions surrounded by the alternate long and two short dashed lines) is exposed to light, to form exposed patterns 211a to 211j, as shown in FIG. 2(a). In the following exemplary case, the substrate 201 is conveyed in the Y-axis forward direction such that the substrate 201 shifts, in each exposure shot, by a distance equivalent to three pixels, to change the positional relationship between the photomask 101 and the substrate 201.

Also when the blinking light source 400 emits no light, the conveyor device 300 continues to convey the substrate 201 at a predetermined speed. A time at which the blinking light source 400 emits light is set such that, when the substrate 201 shifts by the distance equivalent to three pixels, to change the positional relationship between the photomask 101 and the substrate 201, the regions on the substrate 201 which are exposed from the openings 111a to 111j are exposed to light on the substrate 201 again, as shown in FIG. 2(b). In the example shown in FIG. 2, five openings are aligned on the photomask 101 in the Y-axis direction. Therefore, when the exposure to light is performed as shown in FIG. 2(b), a portion of the exposed patterns which have been obtained in the immediately preceding exposure (FIG. 2(a)) overlaps a portion of the openings of the photomask 101. For example, the openings 111a, 111b, 111f, and 111g overlap the exposed patterns 211d, 211e, 211i, and 211j, respectively. In the first embodiment, the photomask having five openings aligned in the Y-axis direction is used, and the substrate is moved such that the substrate shifts, in each exposure shot, by a distance equivalent to three pixels, to change the positional relationship between the substrate and the photomask. However, the present invention is not limited thereto. Specifically, the substrate may be moved such that the substrate shifts, in each exposure shot, by a distance equivalent to n colored pixels, to change the positional relationship between the substrate and the photomask (n represents a natural number less than the number of openings aligned in the Y-axis direction in the photomask).

Subsequent thereto, the blinking light source 400 is caused to blink with the substrate 201 being conveyed, and the exposure to light is repeatedly performed multiple times, so that patterning is performed so as to align, in the Y-axis direction, the exposed patterns formed as a plurality of dots, as shown in FIG. 2(c).

While the blinking light source 400 emits no light, the image recognition device 500 shown in FIG. 1 detects a position of the substrate 201, based on the alignment marks (not shown) on the photomask 101 and the exposed patterns on the substrate 201. The photomask moving mechanism 140 moves the photomask 101 in the X-axis direction, according to the position of the substrate 201 which has been detected, and performs alignment between the photomask 101 and the substrate 201 in the X-axis direction for the subsequent exposure to light.

Thereafter, a development process and a baking process are performed. Further, the exposure process, as shown in FIG. 2, using resists of other colors, the development process, and the baking process are repeatedly performed, to obtain a color filter substrate in which colored layers 801 (hatching is different for each color) formed as dots are aligned on the substrate 201 such that the colored layers 801 of the same color are aligned in the Y-axis direction, and the colored layers 801 of different colors are repeatedly aligned in the X-axis direction, as shown in FIG. 3.

As described above, a difference in dimension in the Y-axis direction between the opening of the photomask 101 and the opening region surrounded by the black matrix 600 is greater than a difference in dimension in the X-axis direction between the opening of the photomask 101 and the opening region surrounded by the black matrix 600. Since the alignment in the X-axis direction is performed with a high accuracy, it does not matter if a portion in which the opening of the photomask 101 and the black matrix 600 overlap each other is small. On the other hand, in a case where a portion in which the opening of the photomask 101 and the black matrix 600 overlap each other in the Y-axis direction is relatively increased, even when misalignment in the Y-axis direction is great, formation of a void can be prevented. As an exemplary case, designing is performed such that a portion M in which the colored layer 801 and the black matrix 600 overlap each other in the Y-axis direction is greater than or equal to 2 μm. This is a designed value on the assumption that a maximal value of deviation of position in the Y-axis direction which is caused by distortion of the substrate conveyor shaft of the exposure device, or yawing of the substrate, is about 2 μm.

Figure 4:
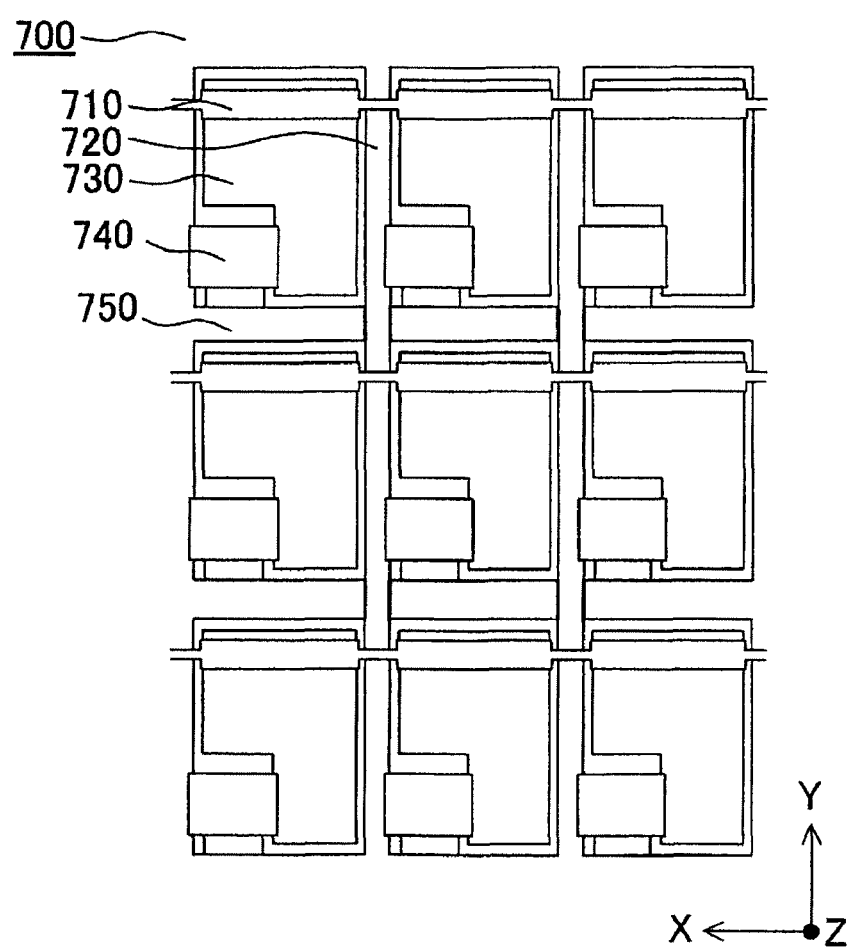
FIG. 4 is a partial plan view of a TFT substrate.

FIG. 4 is a partial plan view of a TFT substrate.

A TFT substrate 700 includes a substrate, a plurality of retention capacity elements 710, a plurality of source wiring lines 720, a plurality of pixel electrodes 730, a plurality of thin-film transistors 740, and a plurality of gate wiring lines 750. The source wiring lines 720 are formed so as to extend in the Y-axis direction, and the retention capacity elements 710 and the gate wiring lines 750 are formed so as to extend in the X-axis direction. When the TFT substrate 700 and the color filter substrate 201 are bonded to each other, the retention capacity element 710 is opposed to a portion in which the colored layer 801 of the color filter substrate 201 and the black matrix 600 overlap each other in the Y-axis direction. The retention capacity element 710 and the gate wiring lines 750 act as light blocking portions in the liquid crystal display device. Therefore, a portion where a width with which the colored layer 801 and the black matrix 600 overlap each other in the Y-axis direction varies in the liquid crystal display device, is opposed to a portion in which light is blocked in the TFT substrate, so that variation in width for overlapping does not affect non-uniformity in display in the liquid crystal display device.

On the other hand, the deviation of position in the X-axis direction which is caused by the distortion of the substrate conveyor shaft, yawing of the substrate, or the rotation of the photomask as described above, is relatively small, and positioning is performed with a high accuracy in a period between the exposures. Therefore, non-uniformity in display which is caused by the deviation in position of the substrate 201 is less likely to be affected.

Figure 5:
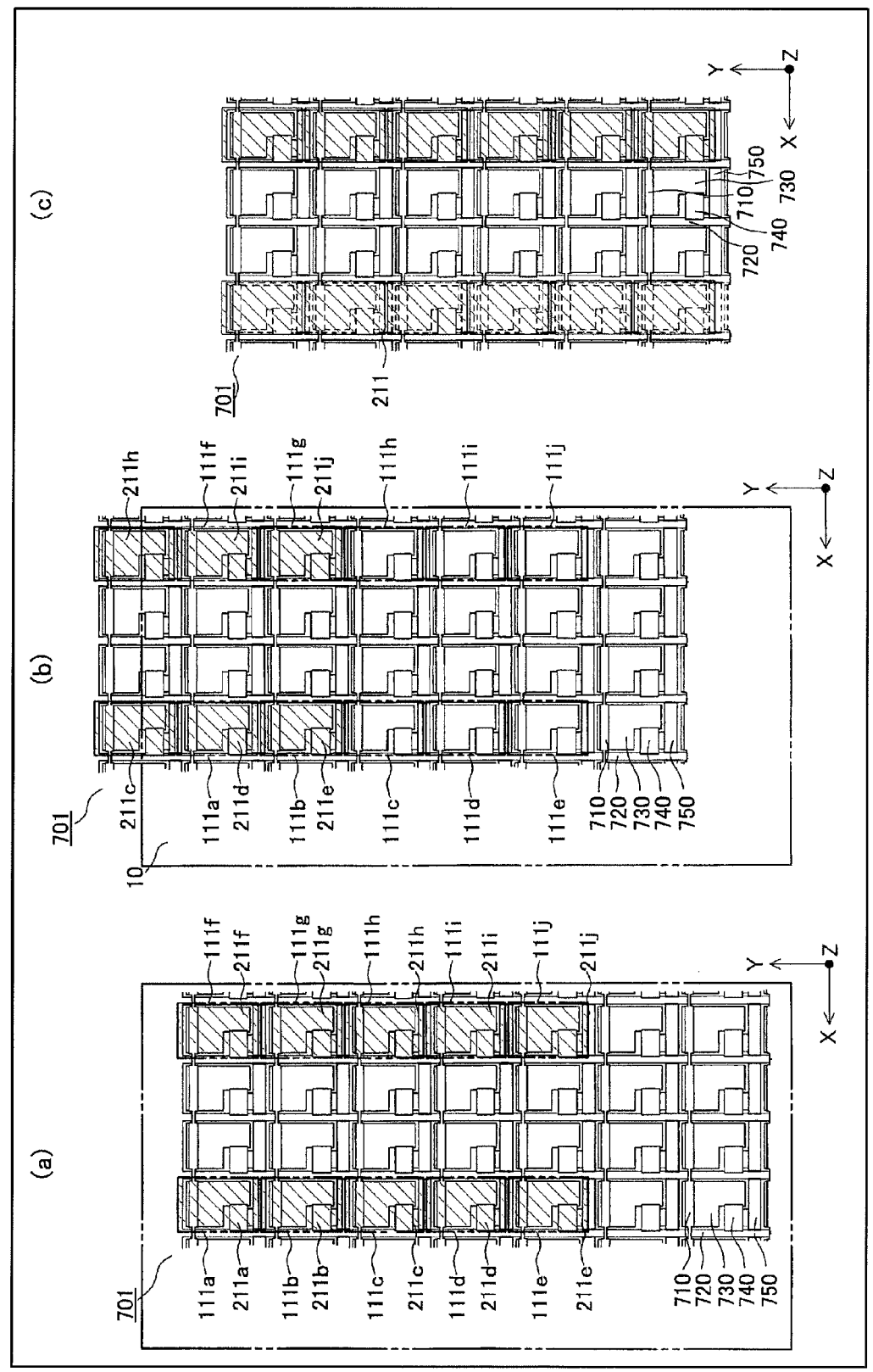
FIG. 5 illustrates another exemplary exposure method according to the first embodiment.
Figure 6:
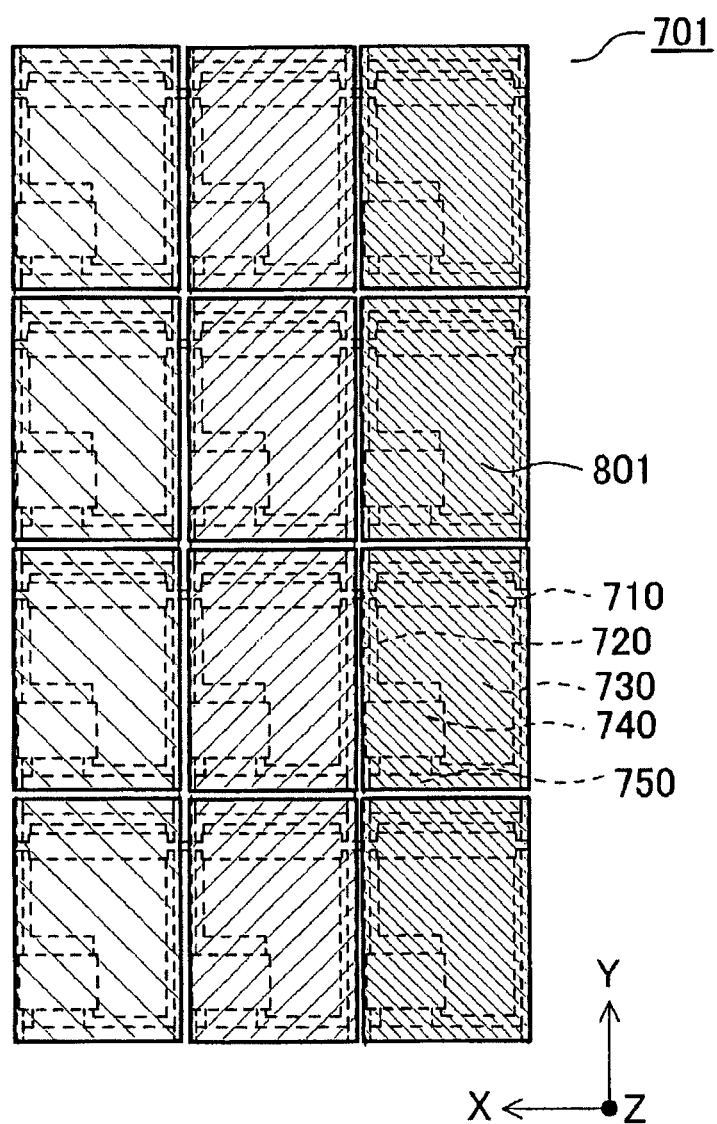
FIG. 6 is a plan view of a color filter substrate obtained by colored layers being formed as dots on the TFT substrate.

FIG. 5 illustrates another exemplary exposure method according to the embodiment of the present invention, and illustrates an exemplary case in which a resist on a TFT substrate is exposed to light. Further, FIG. 6 is a plan view of a color filter substrate obtained by colored layers being formed on the TFT substrate.

Although the exposure method shown in FIG. 5 is the same as shown in FIG. 2, a difference between the illustrated cases is such that a substrate to be exposed to light is a TFT substrate in FIG. 5. Further, FIGS. 5 and 6 illustrate a production method for producing a color filter substrate having a structure in which the colored layers are formed directly on the TFT substrate. In the color filter substrate having such a structure, a colored layer may be provided in at least a region surrounded by each source wiring line 720 and each gate wiring line 750.

Firstly, the plurality of retention capacity elements 710, the plurality of source wiring lines 720, the plurality of pixel electrodes 730, the plurality of thin-film transistors 740, and the plurality of gate wiring lines 750 are formed on a substrate, to produce a TFT substrate 701. The method for producing the TFT substrate 701 is not limited to any specific method, and various methods can be used.

Subsequently, the photomask 101 and the TFT substrate 701 having a resist applied thereto are positioned below the blinking light source 400.

Thereafter, as described with reference to FIG. 2, the blinking light source 400 is caused to blink with the TFT substrate 701 being conveyed in the Y-axis direction, and multiple exposures are intermittently performed. At this time, a time at which light is emitted from a light source is adjusted such that a portion of the exposed patterns which have been obtained in the immediately preceding exposure and a portion of the openings of the photomask 101 overlap each other in each exposure as shown in FIGS. 5(a) and (b). Further, alignment between the photomask and the substrate in the X-axis direction is performed. Consequently, as shown in FIG. 5(c), exposure to light is performed such that the exposed patterns 211 are aligned as dots in the Y-axis direction.

Thereafter, a development process and a baking process are performed. Further, the exposure process, as shown in FIG. 5, using resists of other colors, the development process and the baking process are repeatedly performed, to obtain a color filter substrate in which the colored layers 801 formed as dots are aligned on the TFT substrate 701 such that the colored layers 801 of the same color are aligned in the Y-axis direction, and the colored layers 801 of different colors are repeatedly aligned in the X-axis direction, as shown in FIG. 6. An end portion of each colored layer 801 in the Y-axis direction is positioned on the gate wiring line 750 (which acts as a light blocking portion in the liquid crystal display device). Therefore, variation in width with which the colored layer 801 and the gate wiring line 750 overlap each other in the Y-axis direction is less likely to affect non-uniformity in display in the liquid crystal display device.

Further, since the source wiring line 720 is thinner than the gate wiring line 750, an accuracy for positioning in a direction orthogonal to the source wiring line 720 is significant. In the present embodiment, a direction in which the source wiring line 720 extends conforms to a direction (the Y-axis direction) in which the TFT substrate 201 is conveyed. Therefore, misalignment in a direction (the X-axis direction) orthogonal to the source wiring line 720 is relatively small, and patterning for forming the colored layers on the TFT substrate can be performed, in the X-axis direction, with a high positional accuracy.

As described above, even when misalignment between the colored layer and the black matrix in the Y-axis direction is increased by distortion of the conveyor shaft for the substrate, yawing of the substrate, or a rotation of the photomask, the substrate is conveyed in the direction in which the openings are aligned which correspond to colored pixels of the same color which are continuously aligned, so that a color filter which enables non-uniformity in display to be restrained in the liquid crystal display device can be produced while allowing misalignment in the Y-axis direction.

Modification of First Embodiment

Figure 7:
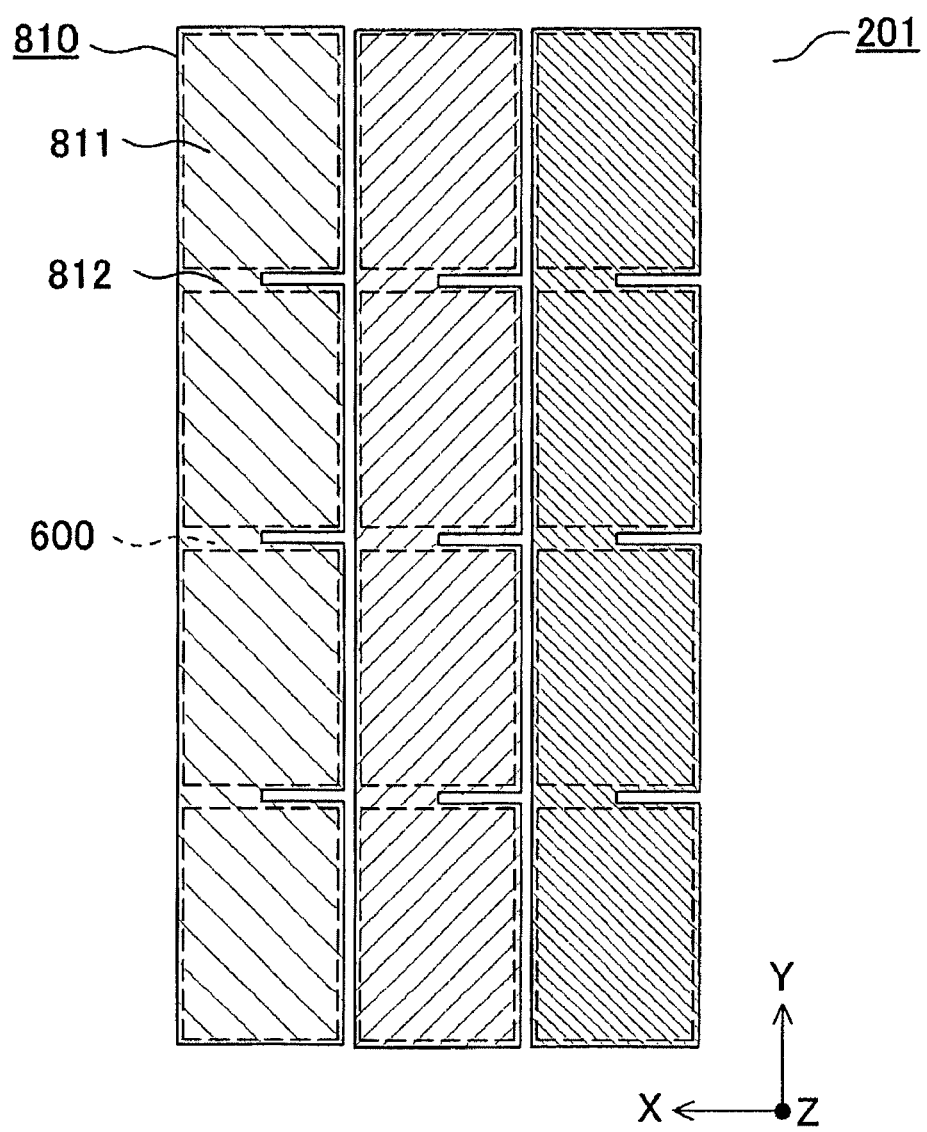
FIG. 7 is a plan view of a color filter substrate according to a modification of the first embodiment.

Colored patterns 810 as shown in FIG. 7 may be adopted instead of colored patterns formed as dots as described above. Each colored pattern 810 includes a plurality of pixel portions 811, and connecting portions 812 connecting between a portion of a short side of one pixel portion and a portion of a short side of the adjacent pixel portion, and connection between each pixel portion 811 and the corresponding connecting portion 812 is repeated in the Y-axis direction. The colored patterns 810 are repeatedly positioned at regular intervals in the X-axis direction. Thus, when the connecting portions 812 are provided, it is advantageous that, for example, photo spacers can be formed on the connecting portions 812.

Second Embodiment

Figure 8:
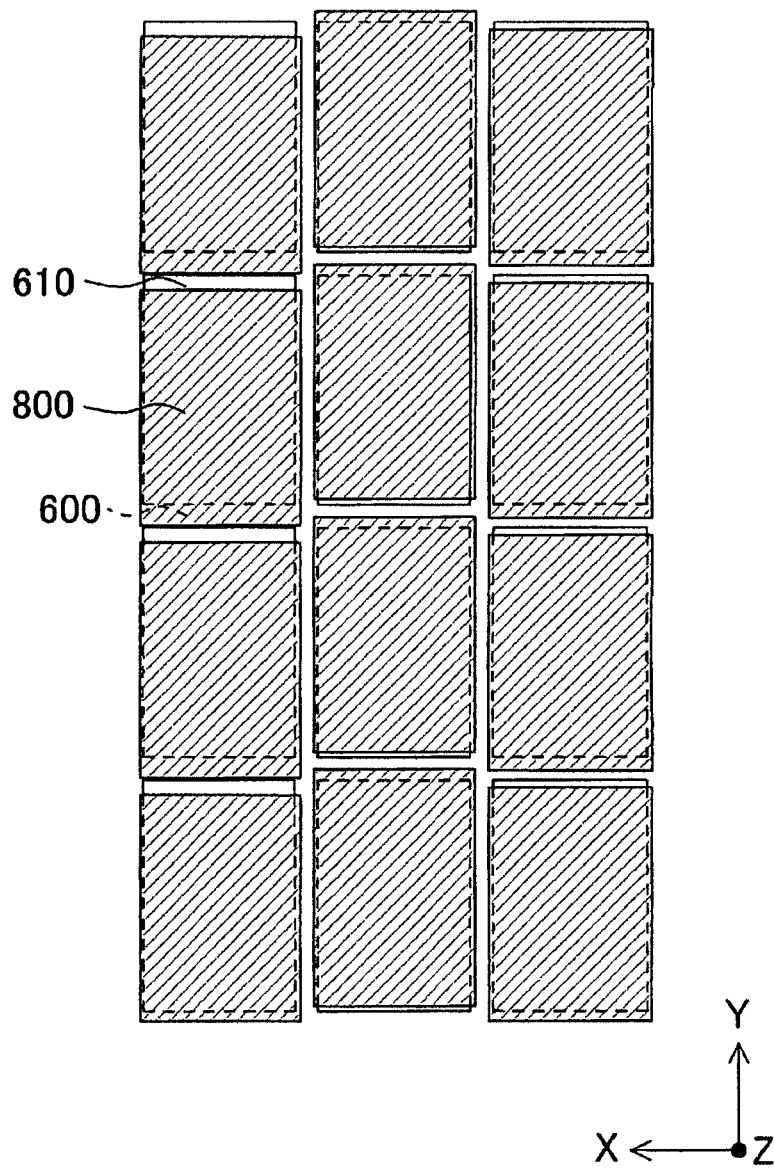
FIG. 8 illustrates a void on a color filter substrate.

In a case where an accuracy for alignment between a photomask and a substrate is deteriorated, or in a case where an opening pattern forming region on one photomask is increased in the X-axis direction, and a distance between an exposed position and the rotation center of the substrate or the photomask is thus increased, misalignment in the Y-axis direction is increased. Further, depending on a shape of a color filter to be produced, a distance between colored pixels adjacent to each other in the Y-axis direction is small, and the width of the colored layer in the Y-axis direction may not be designed so as to be greater than the width, in the Y-axis direction, of an opening surrounded by a black matrix, by 2 μm or more. Consequently, as shown in FIG. 8, a region (hereinafter, referred to as a "void") 610 in which the colored layer 800 is not formed is generated due to misalignment between the colored layer 800 and the black matrix 600 in the Y-axis direction, so that a quality of the color filter may be degraded. In a second embodiment, in order to prevent such a void, colored layers are formed into a striped shape. Hereinafter, a production method for producing a color filter substrate in an exposure method according to the second embodiment will be described with reference to FIG. 9 and FIG. 10 in combination. In the second embodiment, a photomask different from that for the first embodiment is used, and a time at which light is emitted from a light source is different from that for the first embodiment. The same components as in the first embodiment are denoted by the same corresponding reference numerals, and the description thereof is not given.

Figure 9:
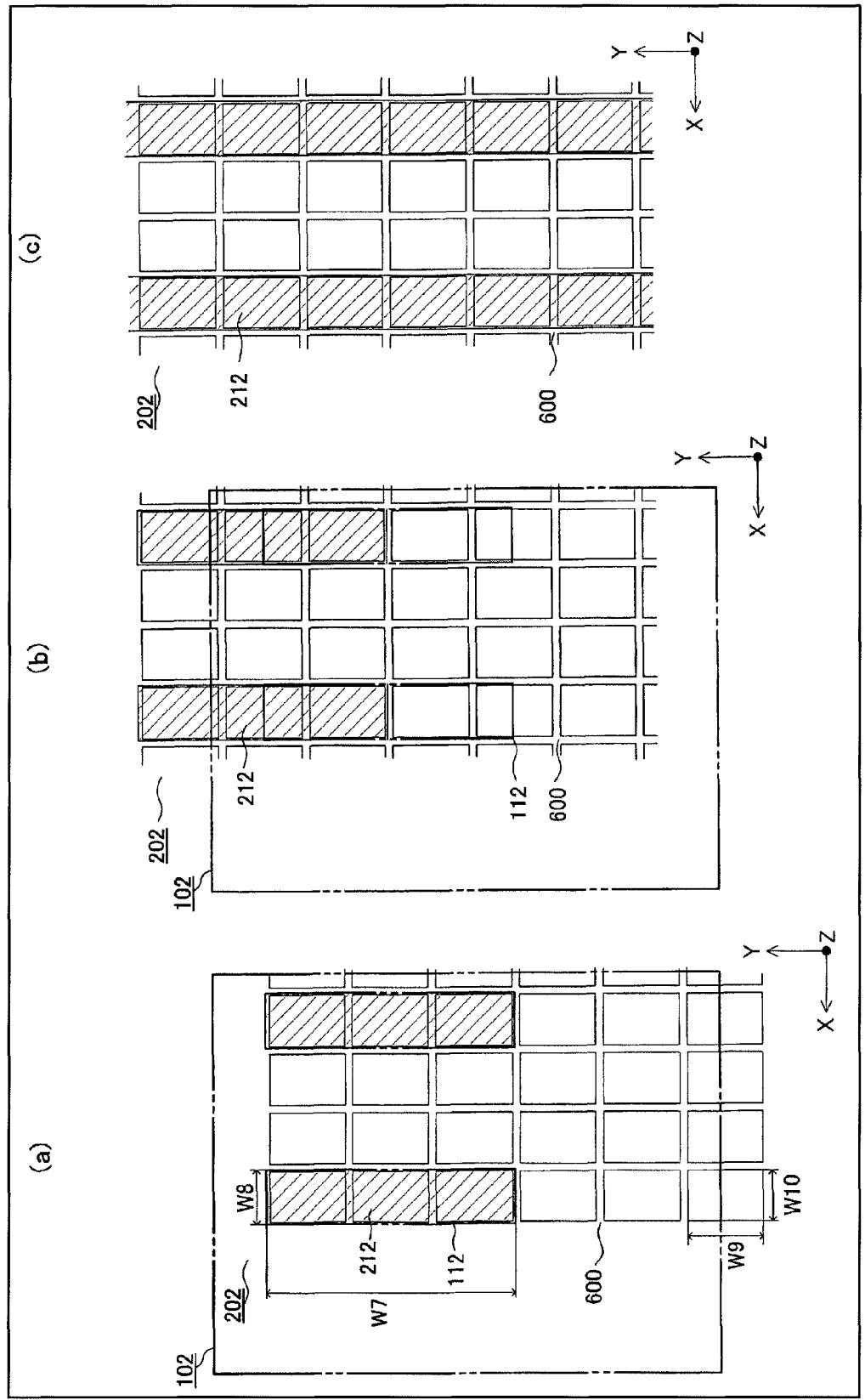
FIG. 9 illustrates an exemplary exposure method according to a second embodiment.
Figure 10:
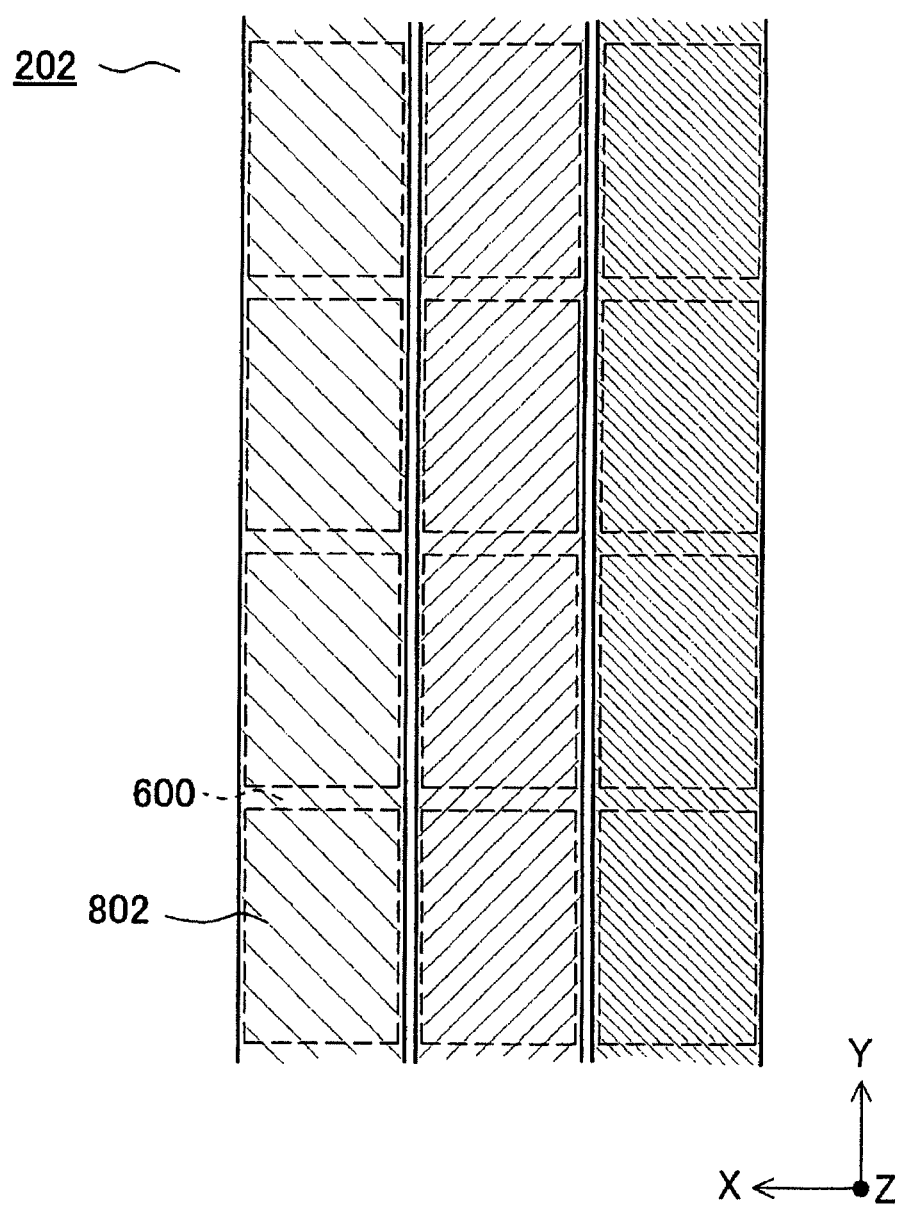
FIG. 10 is a plan view of a color filter substrate obtained by colored layers being formed into a striped-shape on a substrate including black matrixes.

FIG. 9 illustrates an exemplary exposure method according to the second embodiment, and illustrates an exemplary case in which exposure to light is performed on a substrate on which black matrixes are formed. Further, FIG. 10 is a plan view of a color filter substrate obtained by colored layers being formed into a striped shape on a substrate including the black matrixes.

In FIG. 9, rectangular regions indicated by solid lines represent positions of colored pixels on a substrate 202, and hatching regions represent portions in which resists are exposed to light. Further, alternate long and two short dashes lines represent a photomask 102 and openings 112 formed therein. In FIG. 9, due to size limitations of the drawing, a portion of the substrate 202 and a portion of the photomask 102 are illustrated. A difference between a dimension W7 of one opening of the photomask 102 in the Y-axis direction, and a dimension W9, in the Y-axis direction, of one opening region surrounded by the black matrix 600 is greater than a difference between a dimension W8 of one opening of the photomask 102 in the X-axis direction and a dimension W10, in the X-axis direction, of one opening region surrounded by the black matrix 600.

The photomask 102 is positioned so as to be opposed to the blinking light source 400. The substrate 202 having a resist applied thereto is conveyed by the conveyor device 300 so as to be located below the photomask 102. The blinking light source 400 is caused to emit light with the substrate 202 being conveyed in the Y-axis direction, and regions (hatching portions) on the substrate 202 which are exposed from the openings 112 are exposed to light, to form exposed patterns 212, as shown in FIG. 9(a).

Also when the blinking light source 400 emits no light, the conveyor device 300 continues to convey the substrate 202 at a predetermined speed. A speed at which the conveyor device 300 conveys the substrate 202 is set such that, at each exposure time (that is, a time at which light is emitted immediately after a time period in which the blinking light source 400 emits no light has elapsed), a portion of each exposed pattern 212 obtained in the immediately preceding exposure overlaps a corresponding one of the openings 112 of the photomask 102, as shown in FIG. 9(b). Therefore, a region in which the immediately preceding exposure has been performed, and a region in which the most recent exposure is performed become continuous in the direction in which the substrate 202 is conveyed, without forming a break.

Thereafter, the blinking light source 400 is caused to blink with the substrate 202 being conveyed, and multiple exposures are repeatedly performed in a state shown in FIG. 9(b), so that patterning for forming the exposed pattern 212 having a belt-like shape is performed to obtain a striped shape, as shown in FIG. 9(c).

In a period between the exposures, that is, in a period in which the blinking light source 400 emits no light, alignment between the photomask and the substrate in the X-axis direction is performed.

Thereafter, a development process and a baking process are performed. Further, the exposure process using resists of other colors as executed by using the exposure method shown in FIG. 9, the development process, and the baking process are repeatedly performed, to obtain a color filter substrate on which belt-shaped colored layers 802 of multiple colors are formed into a striped shape on the substrate 202, as shown in FIG. 10.

Figure 11:
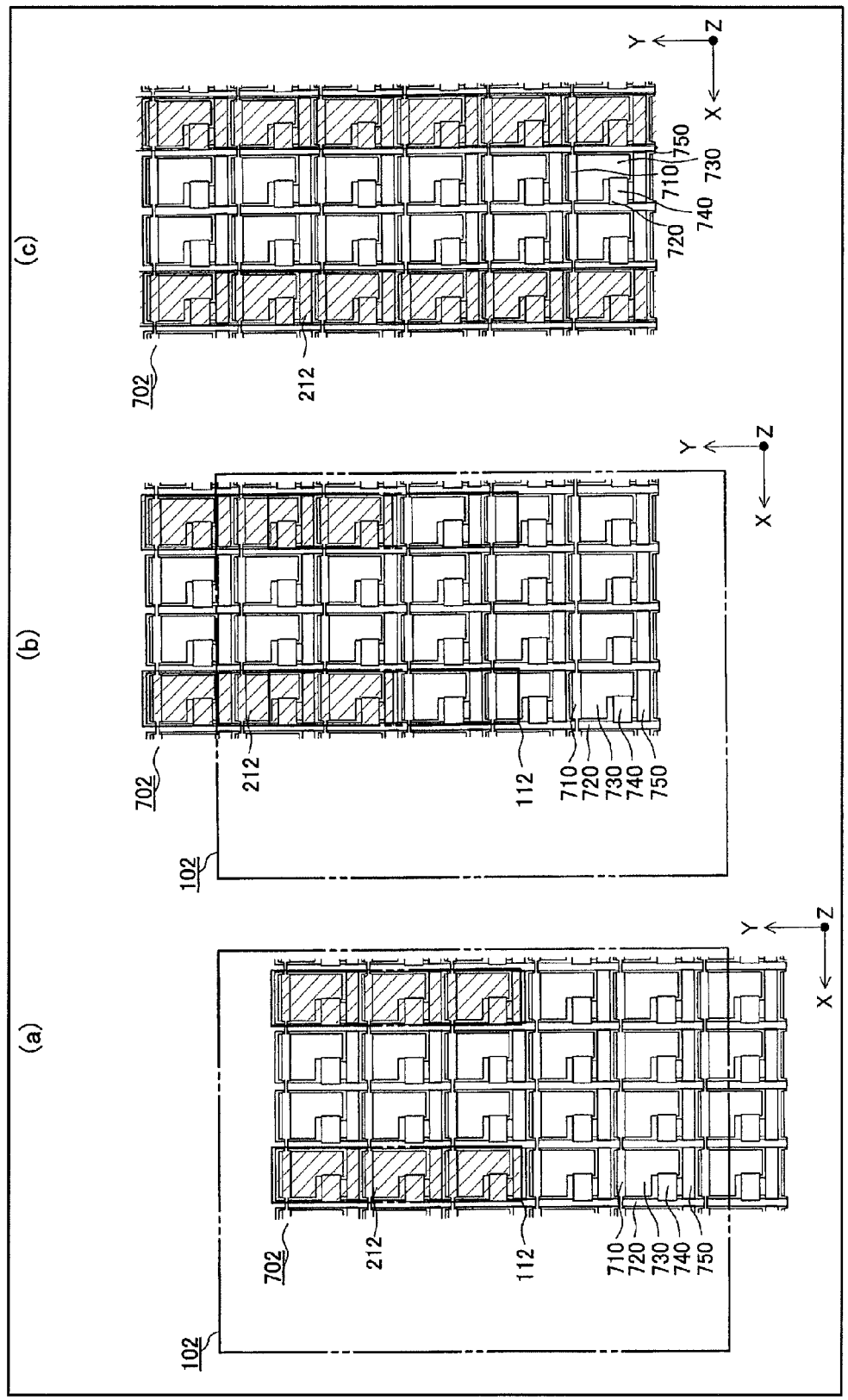
FIG. 11 illustrates another exemplary exposure method according to the second embodiment.

FIG. 11 illustrates another exemplary exposure method according to the embodiment of the present invention, and illustrates an exemplary case in which exposure to light is performed on a TFT substrate. Further, FIG. 12 is a plan view of a color filter substrate obtained by colored layers being formed on the TFT substrate.

The exposure method shown in FIG. 11 is the same as shown in FIG. 9. An exposure process using resists of colors for colored pixels as executed by using the exposure method shown in FIG. 11, a development process, and a baking process are repeatedly performed, to obtain a color filter substrate on which belt-shaped colored layers 802 of multiple colors are formed into a striped-shape on a TFT substrate 702, as shown in FIG. 12.

Figure 12:
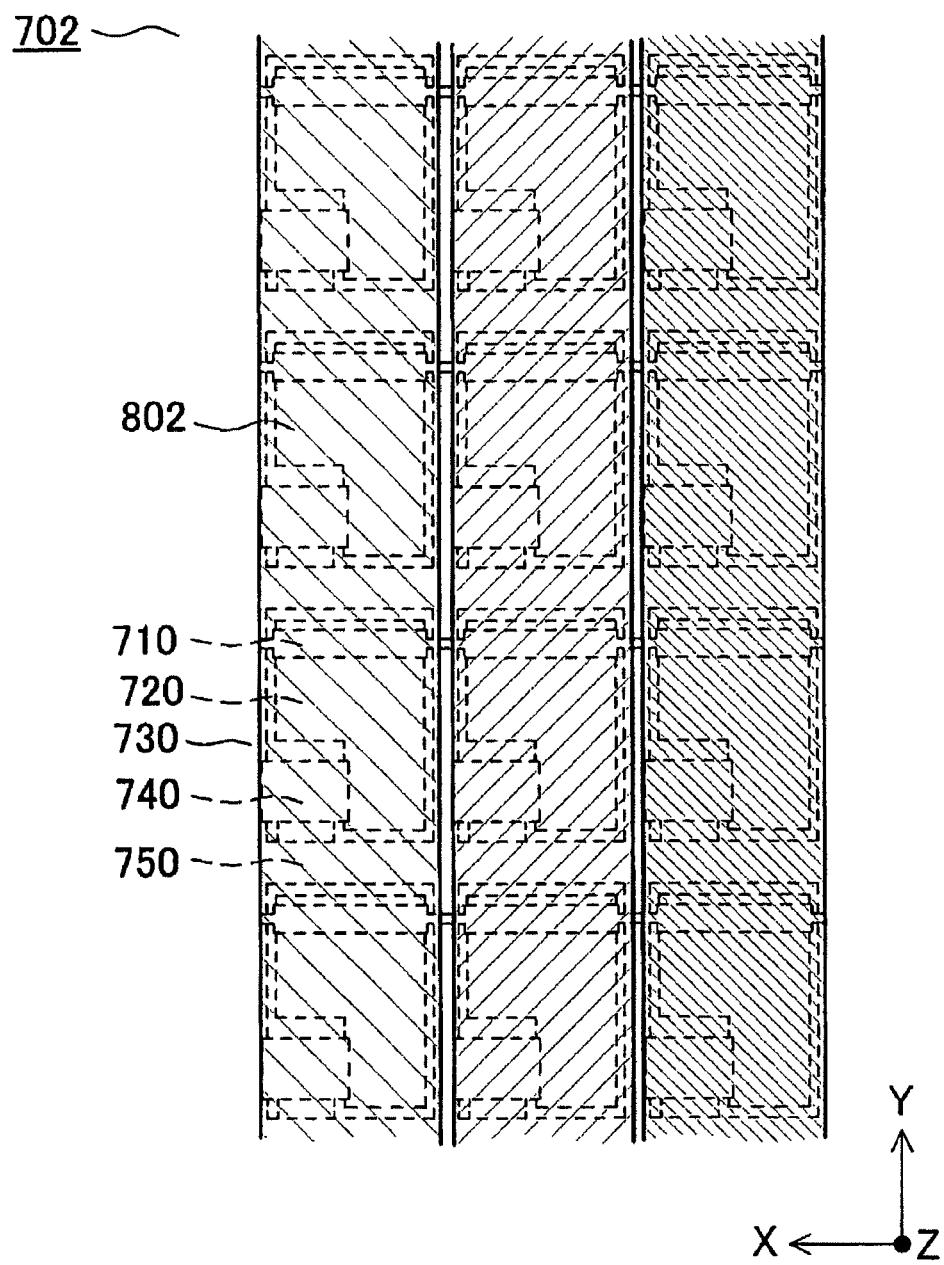
FIG. 12 is a plan view of a color filter substrate obtained by colored layers being formed into a striped-shape on a TFT substrate.
Figure 13:
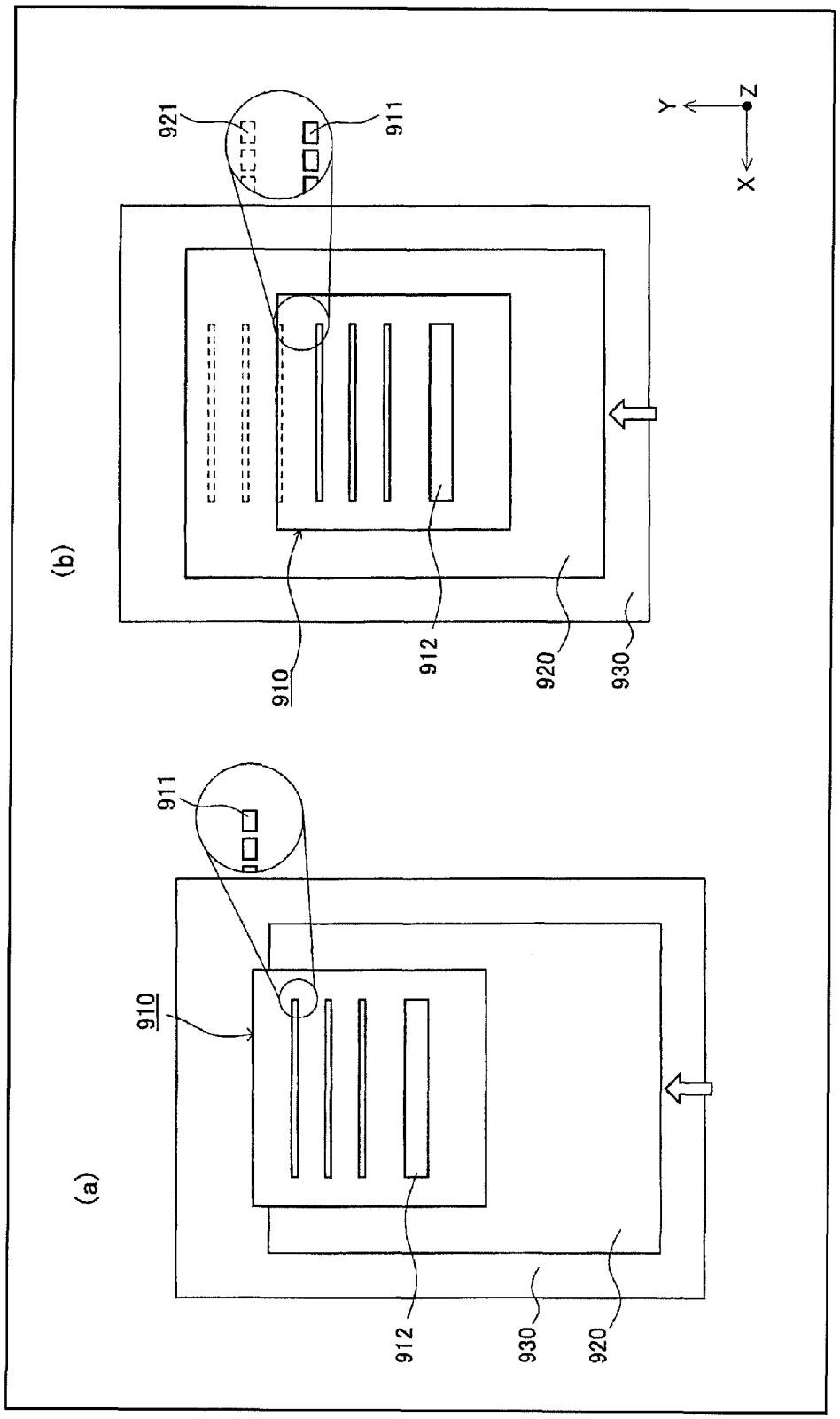
FIG. 13 illustrates a substrate exposure method using a small mask continuous exposure mode.

In the production method for producing a color filter shown in FIGS. 11 and 12, even when misalignment between the photomask and the TFT substrate in the Y-axis direction is increased due to a distortion of a substrate conveyor shaft, yawing of the TFT substrate, or a rotation of the photomask, reduction of an aperture ratio which is caused by no colored pixels being formed on a pixel electrode can be prevented.

As described above, in the exposure method according to the second embodiment, the colored layers 802 can be formed into a striped shape without a break in the Y-axis direction of the substrate. Therefore, in the second embodiment, the colored layers can be obtained by the exposure without occurrence of a problem of misalignment in the Y-axis direction. As a result, even when misalignment between the substrate and the photomask in the Y-axis direction is increased during exposure, non-uniformity in display can be restrained in the liquid crystal display device while the misalignment in the Y-axis direction is allowed, and generation of a void can be prevented.

According to the first and the second embodiments, the substrate conveyor device is configured to hold one side of the substrate by using the conveyor shaft and the substrate securing mechanism. However, the present invention is not limited thereto. For example, a structure in which the substrate is mounted to a movable portion of a linear motor actuator, may be used.

Further, in the first and the second embodiments, an exemplary exposure device including a photomask moving mechanism for adjusting a position of the photomask is described. However, the photomask may be fixed with respect to the blinking light source, and a position may be adjusted in the direction orthogonal to a direction in which the conveyor device performs conveyance.

INDUSTRIAL APPLICABILITY

The present invention is applicable to an exposure method and an exposure device for a color filter substrate for use in liquid crystal display devices, and the like.

DESCRIPTION OF THE REFERENCE CHARACTERS 1 exposure device
101, 102 photomask
111, 112 opening
130 photomask holding mechanism
140 photomask moving mechanism
201, 202 substrate
211, 212 exposed pattern
300 conveyor device
310a, 310b conveyor shaft
320 fixing component
400 blinking light source
500 image recognition device
600 black matrix
700, 701, 702 TFT substrate
710 retention capacity element
720 source wiring line
730 pixel electrode
740 thin-film transistor
750 gate wiring line
800, 801, 802 colored layer

The invention claimed is:
1. An exposure method for forming, while conveying, in a first direction, a substrate having a light blocking layer formed in a grid-like shape, colored pixels of a color filter on the substrate, wherein
 a photomask having a plurality of openings, and the substrate having a resist applied thereto are positioned so as to be opposed to a blinking light source that repeatedly emits light and emits no light,
 the blinking light source is caused to blink while the substrate is being continuously conveyed in the first direction, to intermittently perform multiple exposures,
 the photomask is moved in a second direction orthogonal to the first direction, to perform alignment between the photomask and the substrate, in each exposure,
 intervals at which the blinking light source blinks are controlled in each exposure such that a portion of the plurality of openings of the photomask overlaps a portion of exposed patterns having been obtained through the plurality of openings of the photomask by an immediately preceding exposure, and a difference between a width of each opening of the photomask in the first direction, and a width, in the first direction, of one opening region surrounded by the light blocking layer is greater than a difference between a width of each opening of the photomask in the second direction, and a width, in the second direction, of one opening region surrounded by the light blocking layer.

2. The exposure method according to claim 1, wherein the substrate is a TFT substrate including a plurality of thin-film transistors, a plurality of gate wiring lines, and a plurality of source wiring lines, and each source wiring line extends in a direction orthogonal to the gate wiring lines, and has a line width less than each gate wiring line, and the TFT substrate is positioned relative to the photomask such that a direction in which the plurality of source wiring lines extend is parallel to the first direction.

3. The exposure method according to claim 1, wherein the plurality of openings are formed into a striped shape, and in each exposure, an exposed pattern obtained by the immediately preceding exposure partially overlaps the opening in each column.

4. The exposure method according to claim 1, wherein the plurality of openings are aligned in the first direction and the second direction so as to form a matrix, and in each exposure, a portion of the plurality of openings overlap, in each column, a portion of the exposed patterns obtained through the plurality of openings by the immediately preceding exposure.

5. The exposure method according to claim 1, wherein the substrate has a rectangular shape, and the substrate is conveyed in a state where one side of the substrate along the first direction is secured to a conveyor device.

6. The exposure method for a color filter substrate according to claim 1, wherein the alignment between the photomask and the substrate in the second direction is performed while the blinking light source emits no light.

7. A color filter production method for forming colored pixels on a substrate having a light blocking layer formed in a grid-like shape, wherein an exposure process using the exposure method according to claim 1, and a process of performing development and baking for the substrate having been subjected to the exposure process, are repeatedly performed according to the number of colors of the colored pixels.

8. A color filter production method for forming colored pixels on a substrate having a light blocking layer formed in a grid-like shape, wherein an exposure process using the exposure method according to claim 3, and a process of performing development and baking for the substrate having been subjected to the exposure process, are repeatedly performed according to the number of colors of the colored pixels.

9. A color filter production method for forming colored pixels on a substrate having a light blocking layer formed in a grid-like shape, wherein an exposure process using the exposure method according to claim 4, and a process of performing development and baking for the substrate having been subjected to the exposure process, are repeatedly performed according to the number of colors of the colored pixels.

10. A color filter production method for forming colored pixels on a substrate having a light blocking layer formed in a grid-like shape, wherein an exposure process using the exposure method according to claim 5, and a process of performing development and baking for the substrate having been subjected to the exposure process, are repeatedly performed according to the number of colors of the colored pixels.

* * * * *